US009335380B2

(12) United States Patent
Watanabe et al.

(10) Patent No.: US 9,335,380 B2
(45) Date of Patent: May 10, 2016

(54) DEVICE FOR DETECTING INSULATION DEGRADATION

(75) Inventors: Yoshimasa Watanabe, Tokyo (JP); Ryuichi Nishiura, Tokyo (JP); Yoshiharu Kaneda, Tokyo (JP); Hiroshi Nishizawa, Tokyo (JP); Toru Oka, Tokyo (JP); Hirotaka Muto, Tokyo (JP); Toshiki Tanaka, Tokyo (JP); Yoji Tsutsumishita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 1286 days.

(21) Appl. No.: 13/254,696

(22) PCT Filed: Feb. 8, 2010

(86) PCT No.: PCT/JP2010/051754
§ 371 (c)(1),
(2), (4) Date: Sep. 2, 2011

(87) PCT Pub. No.: WO2010/200998
PCT Pub. Date: Sep. 10, 2010

(65) Prior Publication Data
US 2011/0320146 A1 Dec. 29, 2011

(30) Foreign Application Priority Data
Mar. 5, 2009 (JP) .................................. 2009-052005

(51) Int. Cl.
*G01R 31/34* (2006.01)
*G01R 31/12* (2006.01)

(52) U.S. Cl.
CPC .......... *G01R 31/343* (2013.01); *G01R 31/1227* (2013.01)

(58) Field of Classification Search
CPC ........ G01R 31/025; G01R 1/00; G01R 25/00; H02P 1/00; H02P 2201/00; B60L 11/182; Y02T 10/7005; Y02T 90/122; H01J 5/005
USPC .............. 324/76.21, 551, 633; 361/139, 268; 702/58, 64, 65
See application file for complete search history.

(56) References Cited

U.S. PATENT DOCUMENTS 4,949,362 A * 8/1990 Gaubatz ........................ 376/259
5,691,643 A 11/1997 Ishiguro et al.
(Continued)

FOREIGN PATENT DOCUMENTS

JP 61 155869 7/1986
JP 63 85380 4/1988
(Continued)

OTHER PUBLICATIONS

Combined Office Action and Search Report issued Apr. 2, 2013 in Taiwanese Patent Application No. 099106249 with partial English language translation and English translation of categories of cited documents.
(Continued)

*Primary Examiner* — John Breene
*Assistant Examiner* — Jeffrey Aiello
(74) *Attorney, Agent, or Firm* — Oblon, McClelland, Maier & Neustadt, L.L.P.

(57) ABSTRACT

The invention is related to a device for detecting insulation degradation in an inverter-driven load device, in particular a motor, the device including: zero-phase current measuring means for measuring a zero-phase current in power-feed lines, provided in the power-feed lines between an inverter device and the motor; and command control means for putting rotation of the motor on standby; wherein the zero-phase current measuring means measures the total of phase currents fed into respective phases so as not to rotate a shaft even when an external force is applied to the shaft during the rotation being on standby, whereby allowing regular detection of insulation degradation without switching over the power-feed lines connected with the load device.

5 Claims, 9 Drawing Sheets

1: INVERTER DEVICE
2: CONTROL DEVICE
3: LOAD DEVICE
4: ZERO-PHASE CURRENT SENSOR
5: CURRENT SENSOR
6a, 6b, 6c: POWER-FEED LINE
7: FREQUENCY CALCULATION CIRCUIT
8: SYNCHRONOUS DETECTION CIRCUIT
9: DISPLAY TOOL
90: INSULATION DEGRADATION DETECTION CIRCUIT
101: DEVICE FOR DETECTING INSULATION DEGRADATION

(56) References Cited

U.S. PATENT DOCUMENTS

| | | | |
|---|---|---|---|
| 6,043,664 A * | 3/2000 | Kliman et al. | 324/545 |
| 6,114,859 A * | 9/2000 | Koda et al. | 324/619 |
| 6,320,350 B1 * | 11/2001 | Take | 318/811 |
| 8,289,033 B2 * | 10/2012 | Kajouke | 324/633 |
| 2002/0105300 A1 | 8/2002 | Moriya et al. | 318/727 |
| 2005/0036250 A1 | 2/2005 | Asano | |
| 2005/0093505 A1 * | 5/2005 | Kameya | B62D 5/046 318/805 |
| 2007/0090782 A1 * | 4/2007 | Endo et al. | 318/432 |
| 2008/0094022 A1 * | 4/2008 | Horikoshi et al. | 318/802 |
| 2008/0167826 A1 * | 7/2008 | Murry et al. | 702/58 |
| 2008/0224641 A1 * | 9/2008 | Hoogzaad | H02P 25/026 318/400.34 |
| 2009/0146612 A1 * | 6/2009 | Oyobe et al. | 320/138 |
| 2010/0131215 A1 * | 5/2010 | Kim | 702/58 |

FOREIGN PATENT DOCUMENTS

| | | |
|---|---|---|
| JP | 2 254375 | 10/1990 |
| JP | 2 304380 | 12/1990 |
| JP | 7 239359 | 9/1995 |
| JP | 8 168166 | 6/1996 |
| JP | 8 285903 | 11/1996 |
| JP | 9 19046 | 1/1997 |
| JP | 2000 28671 | 1/2000 |
| JP | 2003 270284 | 9/2003 |
| JP | 2003-274551 | 9/2003 |
| JP | 2005 57965 | 3/2005 |
| JP | 2006 164787 | 6/2006 |
| JP | 2007 159289 | 6/2007 |
| JP | 2008 102096 | 5/2008 |
| JP | 2008 157838 | 7/2008 |
| JP | 2009 025219 | 2/2009 |
| JP | 2009 58234 | 3/2009 |
| JP | 2009058234 A * | 3/2009 |
| JP | 2009 261138 | 11/2009 |

OTHER PUBLICATIONS

International Search Report issued Apr. 13, 2010 in PCT/JP10/51754 filed Feb. 8, 2010.
Combined Office Action and Search Report issued Mar. 28, 2013 in Chinese Patent Application No. 201080007995.4 with English language translation and English translation of categories of cited documents.
Korean Office Action issued Jan. 10, 2013, in Korea Patent Application No. 10-2011-7020490 (with English Translation).
German Office Action issued Dec. 11, 2014 in Patent Application No. 11 2010 000 959.7 (with English Translation).
Office Action issued Nov. 13, 2012 in Japanese Application No. 2011-502699 (With Partial English Translation).

* cited by examiner

1: INVERTER DEVICE
2: CONTROL DEVICE
3: LOAD DEVICE
4: ZERO-PHASE CURRENT SENSOR
5: CURRENT SENSOR
6a, 6b, 6c: POWER-FEED LINE
7: FREQUENCY CALCULATION CIRCUIT
8: SYNCHRONOUS DETECTION CIRCUIT
9: DISPLAY TOOL
90: INSULATION DEGRADATION DETECTION CIRCUIT
101: DEVICE FOR DETECTING INSULATION DEGRADATION

21: OUTPUT WAVEFORM OF CURRENT SENSOR 5
22: OUTPUT WAVEFORM OF ZERO-PHASE CURRENT SENSOR 4

11: CABLE
91: INSULATION DEGRADATION DETECTION CIRCUIT
102: DEVICE FOR DETECTING INSULATION DEGRADATION

10: MOTOR,
11: ROTATION COMMAND DEVICE
103: DEVICE FOR DETECTING INSULATION DEGRADATION

12: INSULATION DEGRADATION DIAGNOSIS DEVICE
92: INSULATION DEGRADATION DETECTION CIRCUIT
104: DEVICE FOR DETECTING INSULATION DEGRADATION

13: PHASE CORRECTION CIRCUIT
93: INSULATION DEGRADATION DETECTION CIRCUIT
105: DEVICE FOR DETECTING INSULATION DEGRADATION

DEVICE FOR DETECTING INSULATION DEGRADATION

TECHNICAL FIELD

The present invention relates to a device for detecting insulation degradation in an inverter-driven device, in particular, a device being favorably utilized as a device for detecting insulation degradation in a motor.

BACKGROUND

The inverter-driven device includes a motor, an uninterruptible power supply (UPS), an electromagnetic cooker, and lighting or the like. Any device may suffer insulation degradation due to aging degradation. For example, in case of a motor used for a transport machine, movement of a platform coupled to the motor may cause friction, twist or extension and contraction in a power feeding conductor cable, resulting in a damaged conductor film. In another case of a motor used for a cutting machine, a cutting fluid, oil or the like may be scattered onto the motor, and then run through a shaft thereof to encroach insulating materials inside the motor.

In such a way, a degree of insulation degradation can be varied depending on an environment in use or durability of members. Once a leakage current flows through a portion where this insulation degradation occurs, causing a risk of electrifying human bodies or working an earth leakage breaker. The earth leakage breaker is installed for preventing the electrification of the human body. As a matter of course, the first priority is given to human life. However, once the earth leakage breaker is operated, apparatuses or facilities including the load device of interest are forced to be stopped. Thus, it will take a lot of time to identify how and where the electric leakage has been caused as well as to restore the apparatuses or facilities, thereby lowering the operation efficiency thereof.

Therefore, it is desirable from the viewpoint of condition monitoring and maintenance that an insulating state of the load device can be regularly detected and monitored. For example, as a method of detecting insulation degradation of a motor, there is proposed an insulation monitoring device for detecting insulation degradation by changing over from power-feed lines connected with a load device (e.g., motor) to a closed circuit including an insulation resistance and a ground using a switch, and then applying a voltage to the closed circuit to measure a minute electric current flowing through the closed circuit (See Patent Document 1 and others).

PRIOR ART DOCUMENT

Patent Document

| | |
|---|---|
| [PATENT DOCUMENT 1] | JP 2008-102096 A |
| [PATENT DOCUMENT 2] | JP 2007-159289 A |
| [PATENT DOCUMENT 3] | JP 8-285903 A (1996) |
| [PATENT DOCUMENT 4] | JP 9-19046 A (1997) |
| [PATENT DOCUMENT 5] | JP 2-304380 A (1990) |
| [PATENT DOCUMENT 6] | JP 63-85380 A (1988) |
| [PATENT DOCUMENT 7] | JP 2009-261138 A |
| [PATENT DOCUMENT 8] | JP 7-239359 A (1997) |

DISCLOSURE OF THE INVENTION

Problem to be Solved by the Invention

A trigger and a progressing degree of insulation degradation can be varied depending on a device in use or an environment in use. In conventional approaches, by changing over from a power-feed circuit connected with a load device to a closed circuit including an insulation resistance and a ground using a switch, insulation degradation diagnosis of the device is regularly performed.

However, when the power-feed lines is switched over to perform the insulation degradation diagnosis, a user has to completely stop driving the load device. Thus, a diagnosis timing of the insulation degradation is limited to before or after driving the load device. Particularly, in a device requiring a long term continuous operation, there is a problem that the insulation degradation cannot be preliminarily detected.

An object of the present invention is to provide a device for detecting insulation degradation, capable of detecting the insulation degradation in an inverter-driven device without switching over power-feed lines connected with a load device.

Means for Solving the Problem

In order to achieve the above object, according to the present invention, there is provided a device for detecting insulation degradation in an inverter-driven load device, including:

means for measuring a zero-phase current in power-feed lines, provided in the power-feed lines between an inverter device and the inverter-driven load device;

means for acquiring a frequency of a phase current in at least one phase of the power-feed lines; and signal analysis means for performing a signal analysis on a measurement result of the zero-phase current;

wherein the signal analysis means performs Fourier transform on the measured zero-phase current signal so as to extract only a signal corresponding to a fundamental wave component of the phase current.

Further, according to the present invention, there is provided a device for detecting insulation degradation in an inverter-driven motor, including:

zero-phase current measuring means for measuring a zero-phase current in power-feed lines, provided in the power-feed lines between an inverter device and the motor; and command control means for putting rotation of the motor on standby;

wherein the zero-phase current measuring means measures the total of phase currents fed into respective phases so as not to rotate a shaft even when an external force is applied to the shaft during the rotation being on standby.

It is preferable in the present invention that the device further includes:

means for acquiring a frequency of the phase current in at least one phase of the power-feed lines; and signal analysis means for performing a signal analysis on a measurement result of the zero-phase current;

wherein the signal analysis means performs Fourier transform on the measured zero-phase current signal so as to extract only a signal corresponding to a fundamental wave component of the phase current.

It is preferable in the present invention that the device further includes:

means for measuring a value of the phase current in at least an (N−1) phase in case of the motor being N-phase driven (where N is a natural number); and calculation means for calculating an insulation resistance of each phase;

wherein the calculation means calculates the insulation resistance of each phase based on values of the zero-phase current and the phase current of each phase which are each measured in different states that the shaft of the motor is set at N or more different fixing positions.

Effect of the Invention

According to the present invention, insulation degradation in the inverter-driven device can be detected while eliminating influences such as power-supply noise and carrier noise during inverter-driving. Particularly, in a case where the load device is the motor, not only in a rotating state of the motor but also in a standby state to fix the shaft of the motor even when the external force is applied to the shaft, insulation degradation can be detected without switching over the power-feed lines between the inverter device and the load device to another circuit. Therefore, even in a motor requiring a long term continuous operation, a sign of the insulation degradation can be found at an earlier stage.

EMBODIMENT FOR CARRYING OUT THE INVENTION (Embodiment 1)

Figure 1:
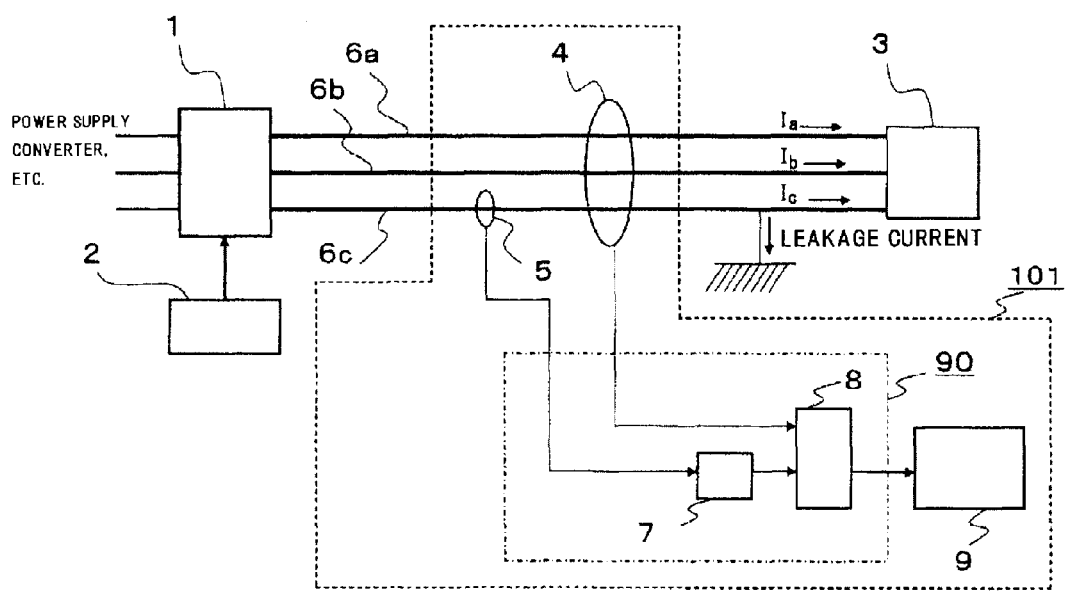
FIG. 1 is a configuration diagram showing a device for detecting insulation degradation according to Embodiment 1 of the present invention.

FIG. 1 is a configuration diagram showing a device 101 for detecting insulation degradation according to Embodiment 1 of the present invention. A load device 3 is driven by feeding phase currents from an inverter device 1 via power-feed lines 6a, 6b and 6c to the load device 3. For example, the inverter-driven load device may include a motor, an uninterruptible power supply (UPS), an electromagnetic cooker, and lighting or the like. A control device 2 has a function of controlling the inverter driving to transmit control signals for waveforms, amplitudes and cycles of three phase driving currents to the inverter device 1 in accordance with a method for driving the load device.

The device 101 for detecting insulation degradation according to the present invention includes a zero-phase current sensor 4, a current sensor 5, and an insulation degradation detection circuit 90.

The zero-phase current sensor 4 is provided in the middle of the power-feed lines 6a, 6b and 6c, and has a function of measuring a zero-phase current in the power-feed lines. The zero-phase current expresses a leakage current flowing via an insulation resistance to the ground. For the zero-phase current sensor 4, in consideration with the facts that signals outputted from the inverter device 1 are AC signals and that the current leaking through the insulation resistance is a minute current, for example, a zero-phase current transformer (ZCT) or a flux-gate current sensor can be preferably used. It should be noted that although not shown, a ground terminal of the inverter device 1 may be connected with a ground terminal of the load device 4 using an earth cable.

The current sensor 5 is provided at any one location among the power-feed lines 6a, 6b and 6c, and has a function of measuring the respective phase currents flowing through the load device 3. For the current sensor 5, in consideration with the fact that the signals outputted from the inverter device 1 are AC signals, for example, a hall CT having a current transformer (CT) and a hall element can be preferably used. However, a proper current sensor is desirably selected based on an upper limit current value of the fed phase current. In case where the minute current is to be measured, a flux-gate current sensor or a shunt resistor which is directly inserted into the line may be used.

The insulation degradation detection circuit 90 includes a frequency calculation circuit 7, and a synchronous detection circuit 8. The frequency calculation circuit 7 calculates a frequency based on a cycle of the phase current measured by the current sensor 5. The synchronous detection circuit 8 performs Fourier transform on the zero-phase current signal measured by the zero-phase current sensor 4 so as to extract only a component (fundamental wave) corresponding to the frequency of the phase current calculated by the frequency calculation circuit 7.

Further, the insulation degradation detection circuit 90 transmits a calculation result of the synchronous detection circuit 8 to a display tool 9, such as a display, to regularly display transition of the calculation result, so that the insulation degradation can be visually detected. Although not shown, the resulting insulation degradation may be notified to a user using an earth leakage breaker, a leakage relay, an alarm buzzer, or the like other than the display tool 9, otherwise any function may be added as required by the user when the insulation degradation occurs.

Next, a method for detecting insulation degradation will be described below. The cycle of the phase current fed to the load device 3 may be either a fixed cycle or a variable cycle in accordance with a driving specification of the load device 3. Hereinafter, the case of the variable cycle will be discussed.

Due to a characteristic of the inverter device 1, when converting a DC signal into an AC signal, it becomes an AC waveform with which carrier noise, power-supply noise and the like are overlapped. In order to measure the zero-phase current with high precision, only a fundamental wave component is desirably measured while removing these noises. Incidentally, when only a fundamental wave component is extracted using a band pass filter, a relatively wide pass band must be set up in consideration of the varied cycle, so that a sufficient noise removing effect cannot be achieved.

In order to solve the above problem, noise removal is performed on the output signal of the zero-phase current sensor with respect to the cycle of the phase current waveform by utilizing such relationship that the cycle of the zero-phase current waveform matches with the cycle of the phase current waveform (but not necessarily matches in phase).

Specifically, firstly, a period corresponding to one cycle is extracted from the measured phase current waveform to calculate the frequency. Then, a waveform present in the same period as the above period is extracted from the zero-phase current waveform measured simultaneously with the phase current. Then, Fourier transform is performed on the extracted waveform, so as to perform synchronous detection on the conversion result to extract only a component corresponding to the frequency of the phase current.

By employing the above method, even when the frequency of the phase current is varied, the fundamental wave component of the zero-phase current having the same cycle as one cycle of the phase current can be determined with high precision.

Figure 2:
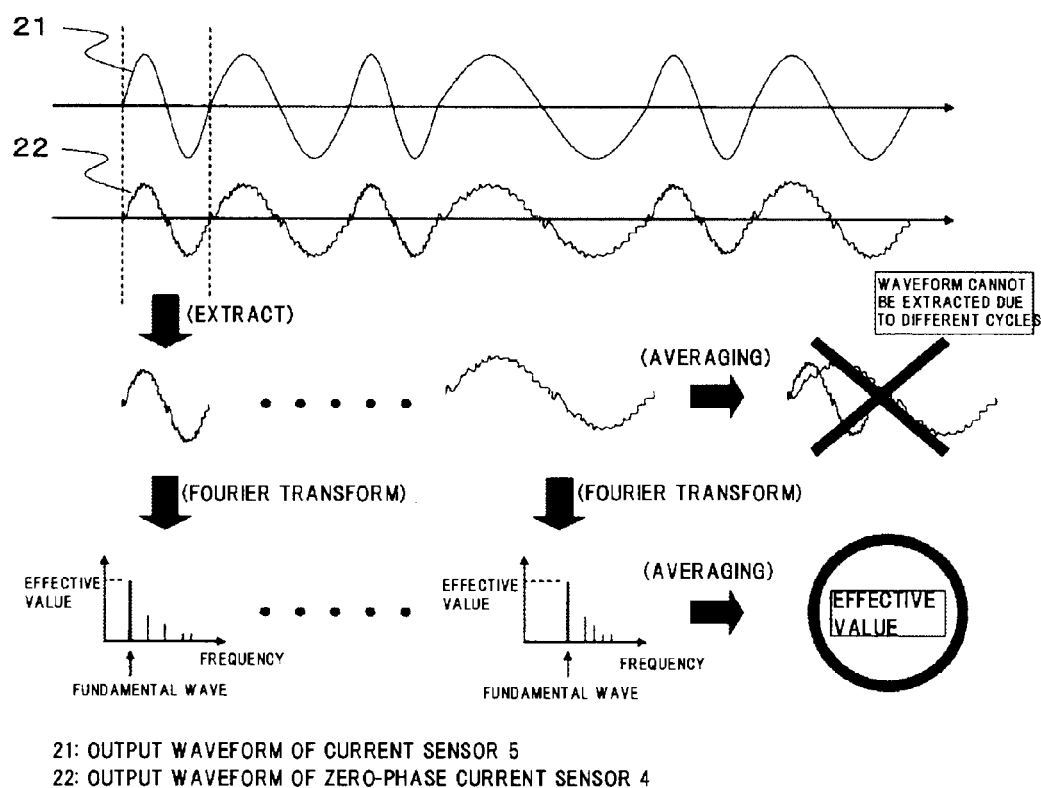
FIG. 2 is a schematic illustrative diagram of waveform processing in case where a cycle of a phase current is variable.

FIG. 2 is a schematic illustrative diagram of waveform processing in case where the cycle of the phase current is variable. This exemplifies an output waveform 21 of the current sensor 5 and a noise-rich output waveform 22 of the zero-phase current sensor 4, in case where the cycle of the phase current fed to the load device 3 is varied. Since the cycle of the phase current fed to the load device 3 is varied moment by moment, each period (interval) corresponding to each of one cycles of the output waveforms 21 and 22 is varied.

When extracting the zero-phase current waveform for every one cycle from the phase current waveform, and then superposing and averaging the extracted waveforms (in a manner similar to an averaging function of oscilloscopes using a trigger), these waveforms do not match with each other and cannot be accurately averaged, because of the varied cycle of the zero-phase current in accordance with the cycle of the phase current.

Meanwhile, Fourier transform can be performed for every one cycle to calculate effective values of the zero-phase current for every one cycle by means of synchronous detection, resulting in converted physical values (effective values) while following the variation in the cycle of the phase current. Therefore, the zero-phase current can be precisely measured with no dependency on the variation in the cycle of the phase current.

It should be noted that although a case where an interval extracted for waveform processing is set as one cycle of the fundamental wave is described above, waveform processing such as averaging processing and Fourier transform may be performed on an interval having plural cycles of the fundamental wave. In other words, averaging processing, such as moving average processing, can be performed on the value of the zero-phase current determined by synchronous detection, or waveforms to be measured can be extracted for every period having little variation in cycle to perform averaging processing thereon, thereby achieving more precise detection of insulation degradation.

Although insulation degradation is detected based on a value of the zero-phase current, insulation degradation may be detected based on a value of the insulation resistance. Specifically, phase voltage can be measured using a voltage measurement device, such as voltage transformer (VT) to calculate an insulation resistance from the relationship between the phase voltage and the zero-phase current. The insulation degradation can be easily detected based on a value of the insulation resistance.

Figure 3:
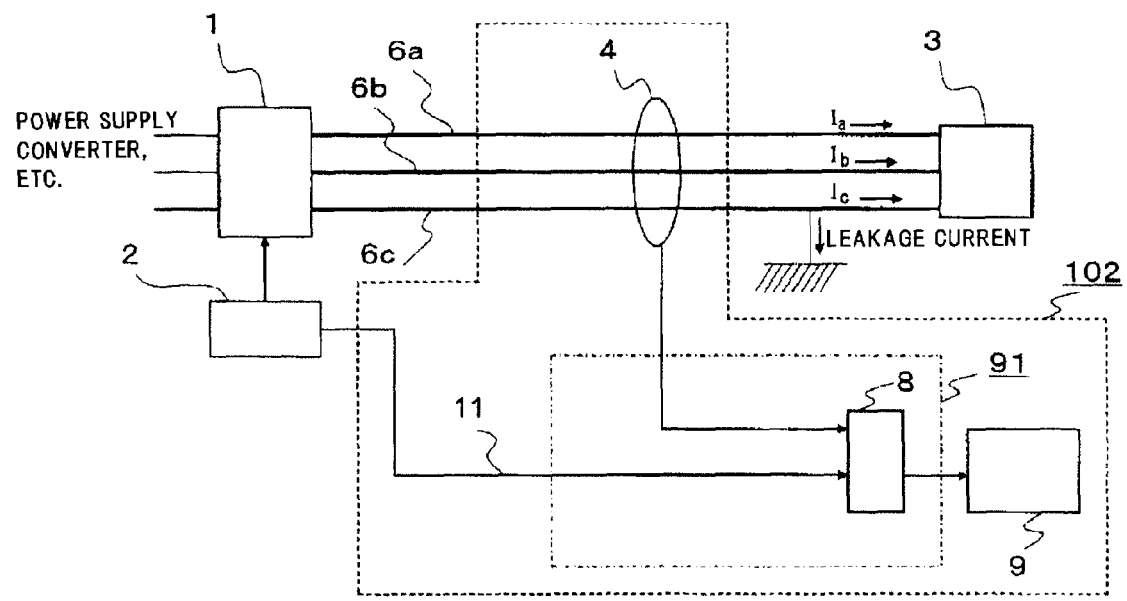
FIG. 3 is a configuration diagram showing another example of the device for detecting the insulation degradation.

Further, a device 102 for detecting insulation degradation shown in FIG. 3 is so configured that information about amplitude, cycle and the like of the phase current is directly supplied from the control device 2 via a wired or wireless information communication means (e.g., cable 11) to the synchronous detection circuit 8. Particularly, in such a embodiment as shown in FIG. 3, the cycle of the phase current and the value of the phase voltage are not directly measured, hence, insulation degradation can be precisely detected without any measurement error. In addition, omission of the current sensor can downsize the whole device.

Although the load device driven with the three phase AC currents is described above by way of example, the present invention can similarly be implemented even in case of a single phase or two phase AC currents. Further, there is no problem when one or more current sensors and one or more zero-phase current sensors are provided. For example, the phase currents in all the three phases can be measured to calculate these frequencies from the waveforms of the phase currents, and then the calculated values can be averaged so as to reduce measurement error, or a measurement mistake can be judged by a comparative check.

In this embodiment, insulation degradation can be detected with high precision with no dependency on the cycle of the phase current fed to the inverter-driven load device.

(Embodiment 2)

Figure 4:
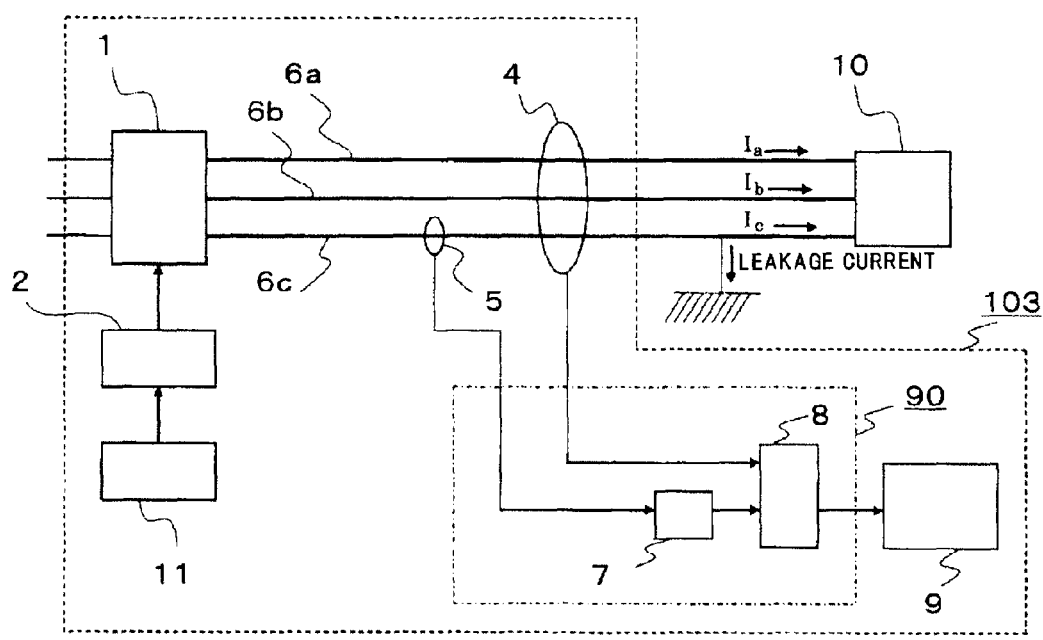
FIG. 4 is a configuration diagram showing a device for detecting insulation degradation according to Embodiment 2 of the present invention.

FIG. 4 is a configuration diagram showing a device 103 for detecting insulation degradation according to Embodiment 2 of the present invention. This embodiment exemplifies a case where a motor 10 is used as the load device 3 in FIG. 1.

The motor 10 can be rotated at a desired rotation speed or stopped at a desired rotation angle by feeding the three phase drive currents from the inverter device 1 via the power-feed lines 6a, 6b and 6c to the motor 10. The control device 2 has a function of controlling the inverter driving to transmit control signals for waveforms, volumes and cycles of the three phase driving currents to the inverter device 1 in accordance with a method for driving the motor 10.

The motor 10 can be mainly in three states including a rotating state, a standby state, and a stopped state, in accordance with its operation condition. The standby state indicates that, among irrotational states of the motor, phase currents are fed to the three phases so as to prevent the shaft of the motor from being carelessly rotated even when an external force is applied to the shaft. Meanwhile, the stopped state indicates that no phase currents are fed at all, that is, a state that the shaft of the motor can be rotated by an external force. Normally, when operating the motor, the motor is shifted from the stopped state through the standby state to the rotating state where the motor is operated depending on the application thereof. Meanwhile, when finishing the operation, the motor is shifted from the rotating state through the standby state to the stopped state.

A rotation command device 11 commands the control device so that the operation state of the motor 10 is in any one of the rotating state, the standby state and the stopped state.

Since the method of detecting insulation degradation of the motor 10 remaining in the rotating state is the same as the method described in Embodiment 1, duplicated description will be omitted.

Next, detection of insulation degradation of the motor 10 remaining in the standby state will be described below. When the motor 10 is in the standby state, the waveforms of the phase currents fed to the respective phases may include ripples and the power-supply noise but can be regarded as substantially DC waveforms. Depending on a fixing position (angle) of the shaft, values of the phase currents are respectively varied. It should be noted that in case where a negligibly small current leaks through floating capacitance of each phase and no currents leak through any resistance component, the sum of the phase currents flowing through the three phases is zero.

Meanwhile, in case where a negligibly small current leaks through floating capacitance of each phase while there is a current leaking through a resistance component, the zero-phase current can be detected using the zero-phase current sensor 4. Incidentally, since the zero-phase current has a substantially DC component as described above, the zero-phase current transformer or the current transformer cannot be used. The zero-phase current sensor 4, such as the flux-gate current sensor, is needed to measure a minute DC current. The current sensor 5 is also needed to measure a DC current.

In this embodiment, in both of the rotating state and the standby state, insulation degradation can be detected. This embodiment is highly different from a conventional method of detecting insulation degradation by switching the power-feed lines 6a, 6b and 6c to other lines in the stopped state of the motor 10.

Although insulation degradation is detected based on a value of the zero-phase current in the above description, insulation degradation may be detected based on a value of the insulation resistance. Specifically, phase voltage can be measured using a voltage measurement device, such as voltage transformer (VT) to calculate an insulation resistance from the relationship between the phase voltage and the zero-phase current. The insulation degradation can be easily detected based on a value of the insulation resistance.

Further, in case of a synchronous motor or an induction motor, the phase voltage can be related to the rotation number of the motor 10 or the phase current fed thereto using mathematical expressions, hence the rotation number of the motor 10 can also be related to the frequency of the phase current using mathematical expressions. That is, when the phase current can be measured by the current sensor 5 to calculate an effective value and the frequency of the phase current, the phase voltage can be easily calculated.

More specifically, in the case of the synchronous motor or the induction motor, the current fed to the motor includes a d-axis current and a q-axis current. The q-axis current is a current component contributing to rotation, while the d-axis current is a current component not contributing to the rotation. Thus, from a point of view of saving energy, the d-axis current not contributing to the rotation is typically controlled to be zero. That is, the phase voltage of the motor exhibits a value proportional to the q-axis current.

When insulation degradation is detected, with the larger value of the phase voltage, the insulation degradation can be detected with higher precision. This is stemming from measurement sensitivity of the zero-phase current sensor. Particularly, the zero-phase current transformer capable of measuring a minuter current among various zero-phase current sensors often includes a material called PC permalloy as a constituent magnetic member. However, the material has a disadvantage that a magnetic characteristic is varied due to a thermal treatment condition of an annealing process, material composition, stress onto the magnetic material, or the like, in particular, reproducibility of a B-H curve is unfavorable in a nonlinear region in the vicinity of an origin of the B-H curve. Particularly, since the non-linear region in the vicinity of the origin is used for detecting a minute current, measurement variation is caused. Therefore, only currents of a few mA or more can be measured with favorable precision in fact.

Meanwhile, the insulation resistance of the motor in a sound state exhibits a few MΩ (mega-ohms) or more. For example, in case where the insulation resistance is 10 MΩ and the phase voltage is 100 V, the leakage current is 10 μA. As apparent from this as well, in order to detect insulation degradation with high precision, it is effective to increase the phase voltage as highly as possible so as to increase the leakage current.

Only when detecting insulation degradation, by feeding the d-axis current not contributing to the rotation in addition to the q-axis current so as to increase the phase voltage, the insulation degradation can be detected with high precision. Such a method of increasing the d-axis current so as to increase the phase voltage is effective in both of the rotating state and standby state of the motor. Particularly, it is noted that when the d-axis current fed in the standby state is an AC component, a current sensor or a zero-phase current sensor capable of measuring a DC and AC component should be selected.

As well as FIG. 3, the present invention can also be implemented in an embodiment that information about amplitude, cycle and the like of the phase current is directly supplied from the control device 2 via the wired or wireless information communication means to the synchronous detection circuit. The insulation degradation can similarly be detected not only with the motor 10 driven with the three phase AC currents but also driven with the single phase or two phase AC currents.

Further, this embodiment describes a case where Embodiment 1 of the present invention is applied to the motor 10. However, for example, even when the insulation degradation detection circuit 90 and the current sensor 5 are not provided, the insulation degradation can be detected.

In this embodiment, insulation degradation can be detected with high precision even when inverter-driven motor is in any one of the rotating state, the standby state and the stopped state.

(Embodiment 3)

Figure 5:
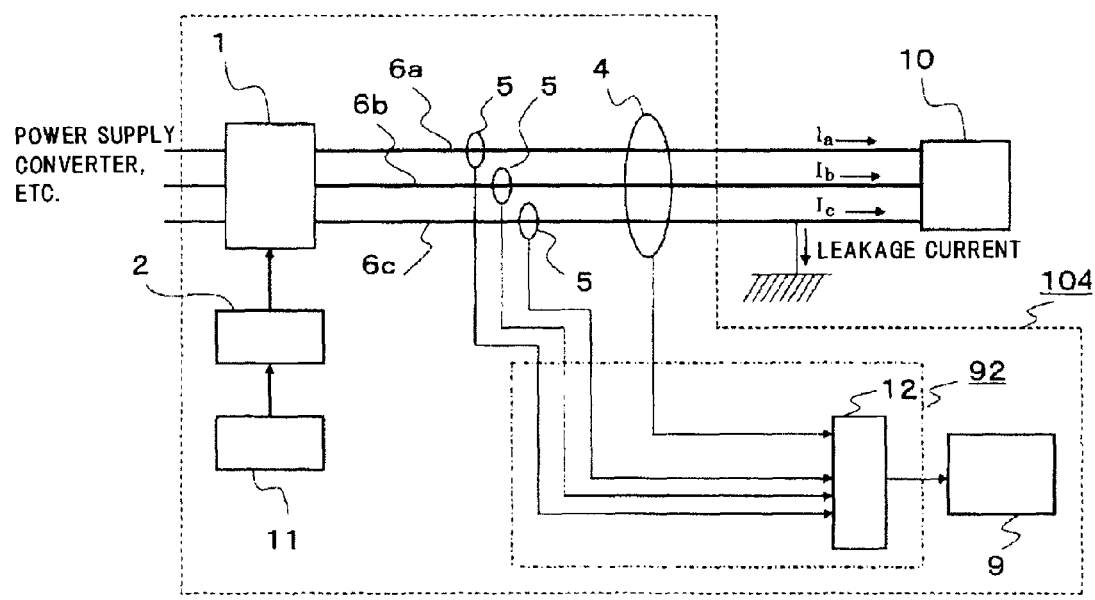
FIG. 5 is a configuration diagram showing a device for detecting insulation degradation according to Embodiment 3 of the present invention.

FIG. 5 is a configuration diagram showing a device 104 for detecting insulation degradation according to Embodiment 3 of the present invention. A device 104 for detecting insulation degradation has the substantially same configuration as the configuration shown in FIG. 4, but further includes current sensors 5 for measuring the phase currents of all the phases as means for measuring the phase currents of the phases, and an insulation resistance calculation circuit 12 for calculating insulation resistance values of the phases. In Embodiment 2, the insulation degradation is detected based on the total of the currents leaking from the power-feed lines 6a, 6b and 6c of the motor 10, that is, the zero-phase current. In this embodiment, the insulation degradation of each phase is detected based on the currents leaking from the phases of the power-feed lines 6a, 6b and 6c of the motor.

Figure 6:
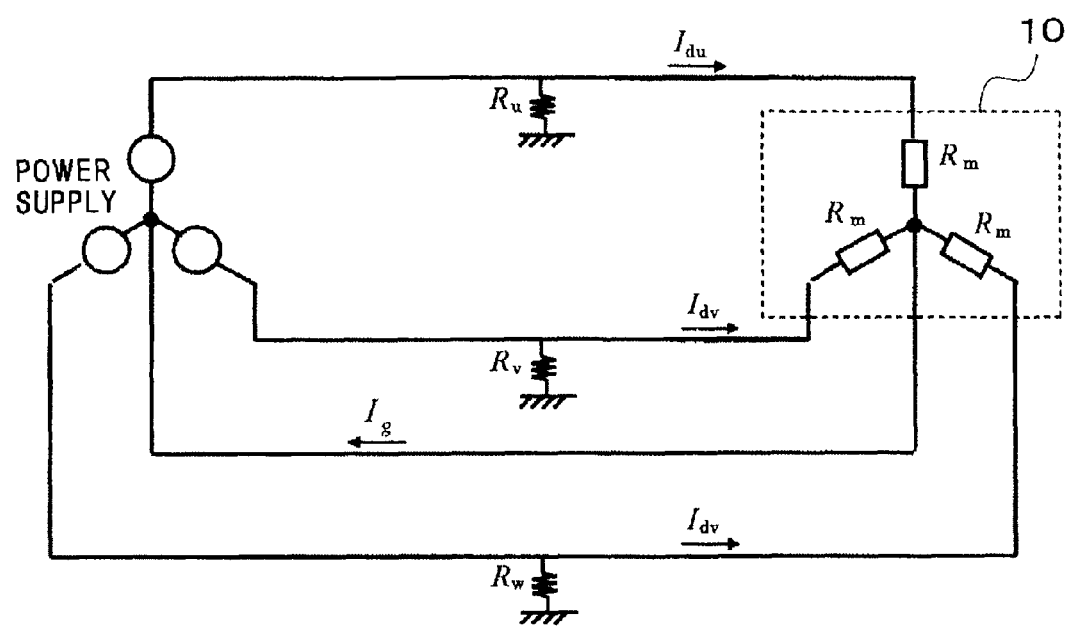
FIG. 6 is a schematic circuit diagram showing an equivalent circuit of a motor.

In case where the insulation resistances in respective phases of the motor 10 are $R_u$, $R_v$ and $R_w$, impedance of each phase of the motor 10 is $R_m$ and the impedance $R_m$ is balanced with the same value in all phases, an equivalent circuit is as shown in FIG. 6.

Next, a calculation method of the insulation resistances $R_u$, $R_v$ and $R_w$ of the phases will be described below. A leakage current $I_g$ can be expressed by the following expression (1) using phase currents $I_{du}$, $I_{dv}$ and $I_{dw}$ of the phases.

[Formula 1]

$$\alpha \cdot I_{du} + \beta \cdot I_{dv} + \gamma \cdot I_{dw} = I_g \quad (1)$$

wherein $\alpha=R_m/R_u$, $\beta=R_m/R_v$, $\gamma=R_m/R_w$, and $R_u$, $R_v$ and $R_w$ are insulation resistances of the respective phases, and $R_m$ is an impedance of each phase, and $I_g$ is a leakage current (i.e., output of the zero-phase current sensor 4, and $I_{du}$, $I_{dv}$ and $I_{dw}$ are phase currents of the respective phases.

Values of the phase currents $I_{du}$, $I_{dv}$ and $I_{dw}$ of the respective phases shown in the expression (1) are values dependent on a standby position (angle) of the shaft. Thus, these values can be varied as the standby position (angle) is varied. In other words, three coefficients $\alpha$, $\beta$ and $\gamma$, each inversely proportional to the insulation resistances $R_u$, $R_v$ and $R_w$ of the respective phases, are unknown values. Therefore, while putting on standby the shaft of the motor in at least three different positions (angles), the corresponding phase currents of the respective phases and the corresponding zero-phase current (leakage current) can be respectively measured. Consequently, the same number of simultaneous equations as the number of the unknown values can be set up, thereby resulting in calculated values of the coefficients $\alpha$, $\beta$ and $\gamma$.

Incidentally, even when the impedance $R_m$ of the motor 10 is not known, but when the coefficients $\alpha$, $\beta$ and $\gamma$ are known, the leakage current can be quantitatively evaluated. Further, the impedance $R_m$ may be measured in advance, so that the values of the insulation resistances of the respective phases can be calculated, and an abnormal phase can also be identified. As a matter of course, when the insulation resistances of the respective phases can be calculated, the insulation resistance of the motor 10 can be easily calculated from the equivalent circuit.

Furthermore, the fixing position (angle) and the fixing number of times for the shaft are dependent on the use environment and the number of driven phases of the motor. The above-described case exemplifies that the number of the driven phases is three, i.e., three phase AC currents. In another case of the two phase AC currents, the shaft may be put on standby at two or more different fixing positions (angles). In yet another case of the single phase AC current, the shaft may be put on standby at one or more different fixing positions (angles). Thus, the same number of simultaneous equations as the number of the unknown values can be set up.

Further, depending on the use environment of the motor by user, in case where an action of temporarily putting the rotation on standby is interposed several times during operation so that the shaft can stand by at three or more different positions (angles), the insulation degradation can be detected using such a method as described above. In other words, during normal operation excluding the time of starting the operation of the motor and the time of finishing the operation, the insulation degradation can be detected without preparing a specific inspection mode or the like.

Even in a case where the rotation cannot temporarily stand by or where the shaft cannot stand by at different positions for the predetermined number of times during the normal operation, the standby state can always be ensured at the time of starting the operation of the motor or at the time of finishing the operation. In this case, for example, by setting an inspection mode to perform measurement until the predetermined number of times is reached and then calculate a solution of the simultaneous equations, the insulation degradation can be detected. In another case where the insulation resistances of the respective phases cannot be calculated in the normal operation excluding the time of finishing the operation, the inspection mode can be set at the time of finishing the operation and the measurement can be performed until the predetermined number of times is reached.

It should be noted that although the phase currents of the respective phases are measured using the three current sensors 5 in the above description, for example, the current sensors 5 may be provided in any two phases among the three phases and the remaining one phase may be calculated backward from a relationship that the total of the three phases currents is zero (provided that the value of the leakage current is sufficiently smaller than the values of the phase currents). In general, where the motor is N-phase driven (N is a natural number), (N−1) current sensors 5 are used to actually measure respective phase currents in (N−1) phases, and the phase current of the remaining one phase can be calculated from a relationship that the total of the phase currents in the N phases is zero.

As well as FIG. 3, the present invention can also be implemented in an embodiment that information about amplitude, cycle, and the like of the phase currents is directly supplied from the control device 2 via the wired or wireless information communication means to the insulation resistance calculation circuit.

As described in Embodiment 2, it is also effective for precise detection of insulation degradation to feed the d-axis current not contributing to the rotation to the motor only at the time of detecting the insulation degradation so as to increase the phase voltage.

In this embodiment, the insulation resistances of the respective phases can be calculated from outputs of the current sensors 5 and the zero-phase current sensor 4 in the standby state of the motor, thereby measurement of an abnormal phase can be performed.

(Embodiment 4)

Figure 7:
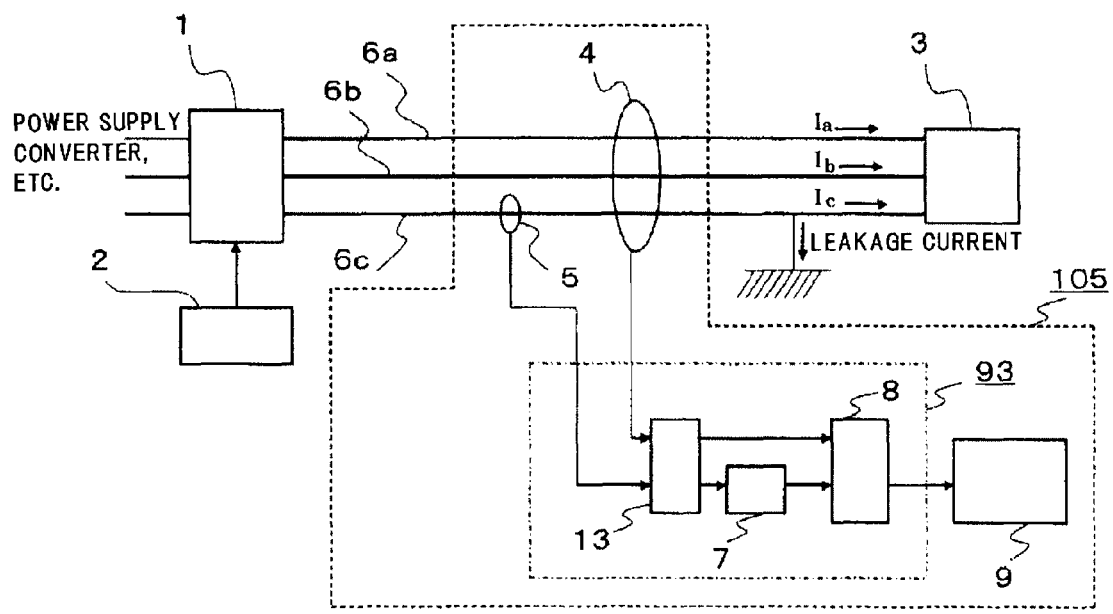
FIG. 7 is a configuration diagram showing a device for detecting insulation degradation according to Embodiment 4 of the present invention.

FIG. 7 is a configuration diagram showing a device 105 for detecting insulation degradation according to Embodiment 4 of the present invention. A device 105 for detecting insulation degradation has the substantially same configuration as the configuration shown in FIG. 1 but an insulation degradation detection circuit 93 further includes a phase correction circuit 13 for matching phases of two signals.

In case where, for example, the zero-phase current transformer or the current transformer is used for the zero-phase current sensor 4 and the current sensor 5, a phase difference may be generated between an input signal and an output signal, depending on a value of a load resistance connected to the zero-phase current transformer or the current transformer, and as a result, there is sometimes a phase difference between the output of the zero-phase current sensor 4 and the output of the current sensor 5.

Next, a problem of the phase difference between the output of the zero-phase current sensor 4 and the output of the current sensor 5 will be described below.

Firstly, input and output phase difference information of the zero-phase current sensor 4 and the current sensor 5 is obtained in advance by evaluating single bodies of the individual sensors.

Figure 8:
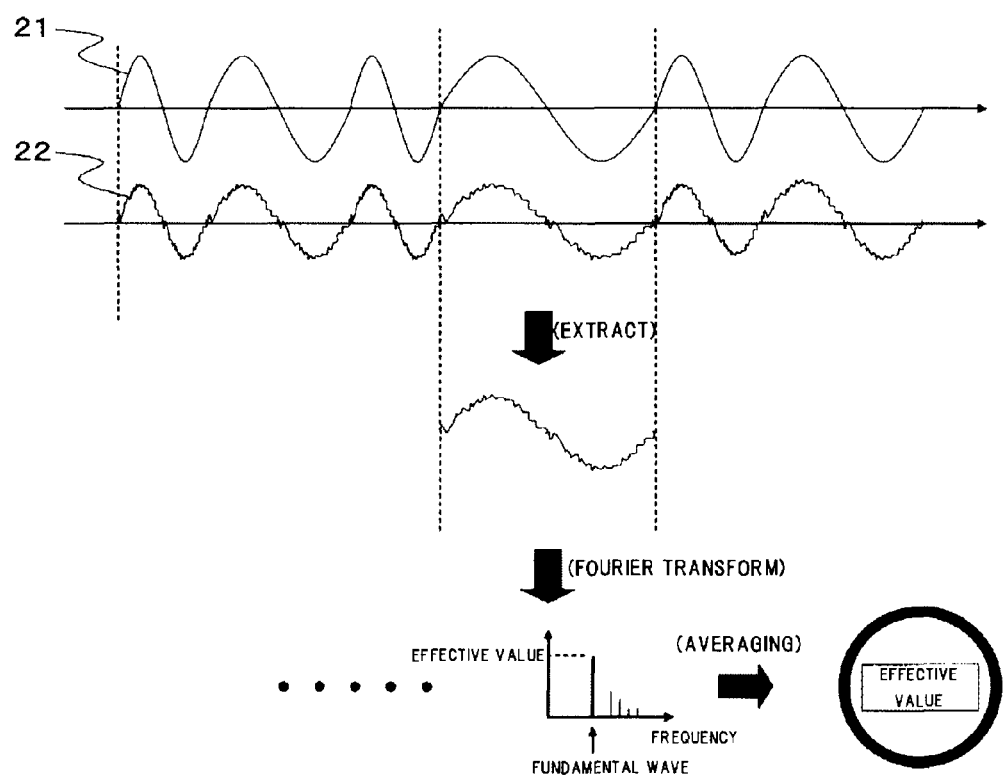
FIG. 8 is a schematic illustrative diagram of waveform processing in case where there is no phase difference between outputs of a zero-phase current sensor and a current sensor.

FIG. 8 is a schematic illustrative diagram of waveform processing in case where there is no phase difference between the outputs of the zero-phase current sensor 4 and the current sensor 5. In case where there is no phase difference, a period of time corresponding to one cycle is extracted from the measured phase current waveform 21, and then a waveform in the same period as the above period is extracted from the zero-phase current waveform 22 measured simultaneously with the phase current. In this case, even when the cycle of the phase current is the fixed cycle or the variable cycle, the extracted waveform of the zero-phase current waveform is the same as one cycle of the phase current.

Figure 9:
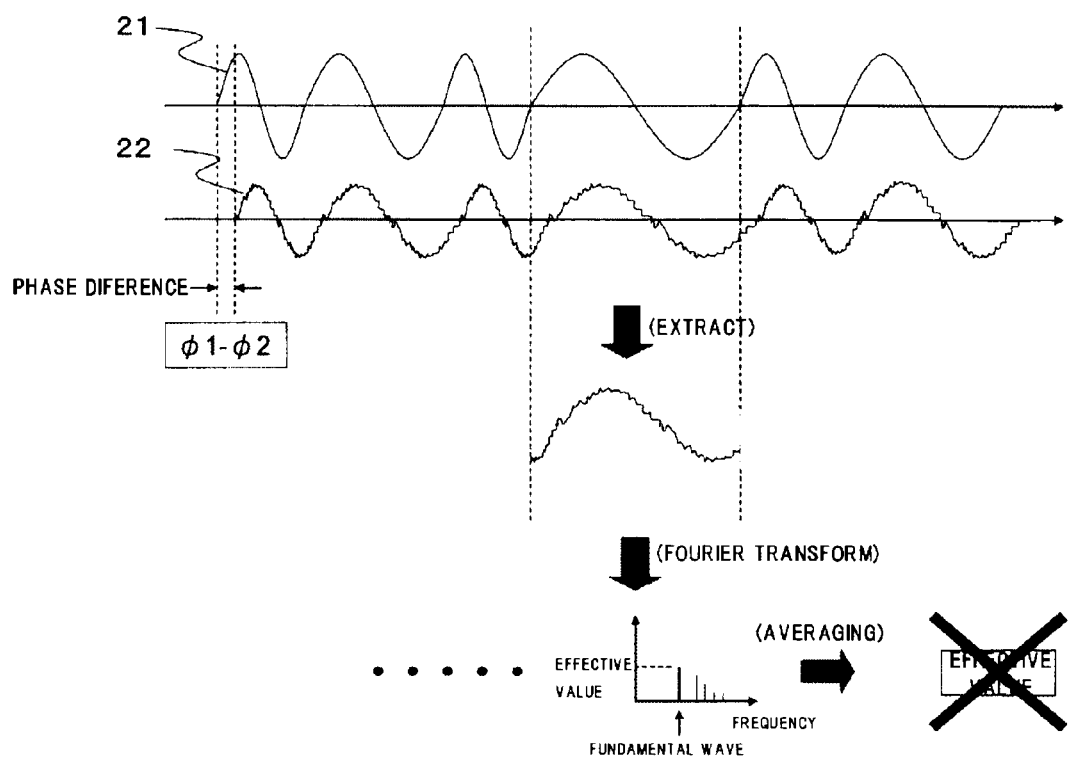
FIG. 9 is a schematic illustrative diagram of waveform processing in case where there is a phase difference between the outputs of the zero-phase current sensor and the current sensor.

Meanwhile, FIG. 9 is a schematic illustrative diagram of waveform processing in case where there is a phase difference between the outputs of the zero-phase current sensor 4 and the current sensor 5. In case where there is a phase difference, a period of time corresponding to one cycle is extracted from the measured phase current waveform 21, and then a waveform in the same period as the above period is extracted from the zero-phase current waveform 22 measured simultaneously with the phase current. In this case, when the cycle of the phase current is the fixed cycle, there is no problem. However, when the cycle of the phase current is the variable cycle, the extracted waveform of the zero-phase current waveform is not matched with one cycle of the phase current. That is, unless taking the phase difference into consideration, a result obtained by performing the Fourier transform will involve an error.

Next, a method of correcting the phase will be described below. An input and output phase difference φ1 of the zero-phase current sensor 4 relative to an input current (reference signal) and an input and output phase difference φ2 of the current sensor 5 relative to the input current (reference signal) are obtained in advance by evaluating the single bodies of the sensors. For example, a current of 60 Hz and 1 A (ampere) may be inputted to the zero-phase current sensor 4 and the current sensor 5 as a primary current, and then the phase difference relative to the output waveform may be experimentally observed using the oscilloscope. More preferably, a relationship of the input and output phase differences where an amplitude and a frequency of the input current are respectively varied is obtained using statistical processing of experimental data.

As described above, in order to set the phase difference between the output of the zero-phase current sensor 4 and the output of the current sensor 5 to be zero, the phase of the output waveform from either the zero-phase current sensor 4 or the current sensor 5 must be corrected so that the phase difference φ1−φ2 is zero. For example, in a case where the phase difference φ1−φ2 is fixed relative to the frequency of the input current, the phase correction circuit 13 of an analog circuit is preferably configured to ensure a certain shift of phase. In another case where the phase difference φ1−φ2 is variable relative to the frequency of the input current, the relationship of the input and output phase differences is stored in advance in a memory or the like, and the phase correction circuit 13 of a digital circuit is preferably configured.

In this embodiment, in case where there is a phase difference between the output of the zero-phase current sensor 4 and the output of the current sensor 5, by setting the phase difference to be zero, that is, by arranging the phase correction circuit 13 for matching the cycles of the zero-phase current waveform 21 and the phase current waveform 22 with each other, the insulation degradation can be detected with high precision.

INDUSTRIAL APPLICABILITY

The present invention is industrially very useful in a point of view that insulation degradation in an inverter-driven device can be detected.

EXPLANATORY NOTE

1: inverter device, 2: control device, 3: load device, 4: zero-phase current sensor, 5: current sensor, 6a, 6b, 6c: power-feed line, 7: frequency calculation circuit, 8: synchronous detection circuit, 9: display tool, 10: motor, 11: cable, 12: insulation degradation diagnosis device, 13: phase correction circuit, 21: output waveform of current sensor, 22: output waveform of zero-phase current sensor, 90, 91, 92: insulation degradation detection circuit, 101, 102, 103, 104, 105: device for detecting insulation degradation.

The invention claimed is:

1. A device for detecting insulation degradation in an inverter-driven motor, comprising:
    command control means for putting rotation of the motor into a rotation standby state in which rotation of a shaft of the motor is prevented even when an external force is applied to the shaft;
    means for measuring a zero-phase current in power-feed lines extending between an inverter device and the motor;
    means for measuring a value of the phase current in at least an (N−1) phase in case of the motor being N-phase driven (where N is a natural number); and
    calculation means for calculating an insulation resistance of each phase;
    wherein the means for measuring the zero-phase current measures the zero-phase current that is a total of phase currents fed into respective phases during the rotation standby state, and
    wherein the calculation means calculates the insulation resistance of each phase based on values of the zero-phase current and the phase current of each phase which are each measured in different rotation standby states that the shaft of the motor is set at N or more different fixing positions.

2. The device for detecting insulation degradation according to claim 1, wherein the detection of insulation degradation is performed during normal operation excluding a time of starting operation of the motor and a time of finishing the operation of the motor.

3. The device for detecting insulation degradation according to claim 1, wherein the detection of insulation degradation is performed in an inspection mode set at a time of starting operation of the motor or at a time of finishing the operation of the motor.

4. The device for detecting insulation degradation according to claim 1, wherein when the insulation resistances of the respective phases are not calculated during normal operation of the motor excluding a time of finishing operation of the motor, in an inspection mode set at the time of finishing the operation of the motor, a shortfall of measurement is performed to calculate the insulation resistances of the respective phases.

5. A device for detecting insulation degradation in an inverter-driven motor, comprising:
    command control means for putting rotation of the motor into a rotation standby state in which rotation of a shaft of the motor is prevented even when an external force is applied to the shaft; and
    means for measuring a zero-phase current in power-feed lines extending between an inverter device and the motor;
    wherein the means for measuring the zero-phase current measures the zero-phase current that is a total of phase currents fed into respective phases during the rotation standby state, and
    wherein, with regard to a current component fed to the motor, a current component ineffective for torque is increased only at the time of detecting the insulation degradation, so that phase voltage is increased.

* * * * *